US012464901B2

(12) United States Patent
Kwon et al.

(10) Patent No.: US 12,464,901 B2
(45) Date of Patent: Nov. 4, 2025

(54) DISPLAY APPARATUS

(71) Applicant: Samsung Display Co., Ltd., Yongin-si (KR)

(72) Inventors: Ohjeong Kwon, Yongin-si (KR); Seungyeon Jeong, Yongin-si (KR); Wooyoung Kim, Yongin-si (KR); Hongyeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 727 days.

(21) Appl. No.: 17/827,191

(22) Filed: May 27, 2022

(65) Prior Publication Data

US 2023/0086323 A1    Mar. 23, 2023

(30) Foreign Application Priority Data

Sep. 17, 2021 (KR) .......................... 10-2021-0125197

(51) Int. Cl.
*H10K 50/858* (2023.01)
*G06F 3/041* (2006.01)
(Continued)

(52) U.S. Cl.
CPC ......... *H10K 59/122* (2023.02); *H10K 50/858* (2023.02); *G06F 3/0412* (2013.01); *H10K 59/40* (2023.02)

(58) Field of Classification Search
CPC .... H10K 50/858; H10K 59/122; H10K 59/40; H10K 59/8791; H10K 59/8792; H10K 59/879; H10K 59/38; G06F 3/0412
See application file for complete search history.

(56) References Cited

U.S. PATENT DOCUMENTS 11,165,049 B2    11/2021 Joo et al.
2015/0311477 A1*    10/2015 Cho ....................... H10K 59/40
257/40
(Continued)

FOREIGN PATENT DOCUMENTS

JP    2021-039145 A    3/2021
KR    10-2016-0002870 A    1/2016
(Continued)

OTHER PUBLICATIONS

Park, Jin-Seong et al.: "Thin film encapsulation for flexible AM-OLED: a review", Semiconductor Science and Technology, vol. 26, No. 3, Mar. 1, 2011, p. 034001 (9 pages).
(Continued)

*Primary Examiner* — Omar F Mojaddedi
(74) *Attorney, Agent, or Firm* — Womble Bond Dickinson (US) LLP

(57) ABSTRACT

A display apparatus includes: a substrate; a display element arranged on the substrate; a low-reflection inorganic layer arranged on the display element; a light-shielding layer arranged on the low-reflection inorganic layer and including an opening corresponding to an emission area of the display element; a first insulating layer arranged on the light-shielding layer and including an opening corresponding to the emission area of the display element; and a second insulating layer filling the opening of the light-shielding layer and the opening of the first insulating layer, wherein the first insulating layer includes a material configured to absorb light in a wavelength band of about 380 nm to about 500 nm, and a thickness of the first insulating layer is greater than a thickness of the light-shielding layer.

20 Claims, 12 Drawing Sheets

(51) Int. Cl.
*H10K 59/122* (2023.01)
*H10K 59/38* (2023.01)
*H10K 59/40* (2023.01)

(56) References Cited

U.S. PATENT DOCUMENTS

| | | |
|---|---|---|
| 2016/0380235 A1 | 12/2016 | Kim et al. |
| 2019/0013495 A1 | 1/2019 | Kim et al. |
| 2019/0121176 A1* | 4/2019 | Lee ...................... H10K 59/879 |
| 2019/0165074 A1 | 5/2019 | Lee et al. |
| 2019/0221779 A1* | 7/2019 | Jang ...................... H10K 59/122 |
| 2020/0243802 A1* | 7/2020 | Ju .......................... H10K 50/86 |
| 2021/0005845 A1 | 1/2021 | Kim et al. |
| 2021/0175476 A1* | 6/2021 | Oh ......................... H10K 59/38 |
| 2024/0334796 A1* | 10/2024 | Yamazaki ............... H10K 59/00 |

FOREIGN PATENT DOCUMENTS

| | | |
|---|---|---|
| KR | 10-2017-0001826 A | 1/2017 |
| KR | 10-2019-0004863 A | 1/2019 |
| KR | 10-2019-0064701 A | 6/2019 |
| KR | 10-2019-0080312 A | 7/2019 |
| KR | 10-2020-0054382 A | 5/2020 |
| KR | 10-2020-0075403 A | 6/2020 |

OTHER PUBLICATIONS

Shi, Genggongwo et al.: "Synthesis of New Binder Polymers for Photolithographic Patterning of Black Pixel Define Layers of Organic Light Emitting Diode", Materials Sciences and Application, vol. 10, No. 11, Jan. 1, 2019, pp. 687-696 (10 pages).

* cited by examiner

DISPLAY APPARATUS

CROSS-REFERENCE TO RELATED APPLICATION

This application claims priority to and the benefit of Korean Patent Application No. 10-2021-0125197, filed on Sep. 17, 2021, in the Korean Intellectual Property Office, the entire content of which is incorporated herein by reference.

BACKGROUND

1. Field

One or more aspects of embodiments of the present disclosure relate to display apparatuses.

2. Description of the Related Art

Recently, the usage of display apparatuses has diversified. In addition, as display apparatuses have become thinner and more lightweight, the usage of display apparatuses has gradually expanded. Also, as display apparatuses are utilized in various suitable fields, the demand for display apparatuses providing high-quality images has increased.

SUMMARY

One or more aspects of embodiments of the present disclosure are directed toward a display apparatus in which high-quality (or suitable) images may be provided by improving light efficiency and visibility. However, this objective is an example and does not limit the scope of the present disclosure.

Additional aspects will be set forth in part in the description that follows and, in part, will be apparent from the description, or may be learned by practice of the embodiments of the present disclosure.

According to an embodiment, a display apparatus includes a substrate, a display element on the substrate, a low-reflection inorganic layer on the display element, a light-shielding layer on the low-reflection inorganic layer and including an opening corresponding to an emission area of the display element, a first insulating layer on the light-shielding layer and including an opening corresponding to the emission area of the display element, and a second insulating layer filling the opening of the light-shielding layer and the opening of the first insulating layer, wherein the first insulating layer includes a material configured to absorb light in a wavelength band of about 380 nm to about 500 nm, and a thickness of the first insulating layer is greater than a thickness of the light-shielding layer.

The light-shielding layer may be in black, and the first insulating layer may be in yellow.

The second insulating layer may selectively absorb light in a first wavelength range and light in a second wavelength range of a visible light spectrum.

The first wavelength range may be from about 480 nm to about 505 nm, and the second wavelength range may be from about 585 nm to about 605 nm.

A difference between a refractive index of the first insulating layer and a refractive index of the second insulating layer may be from about 0.1 to about 0.2.

A thickness of the second insulating layer may be from about 2 to about 5 times greater than the thickness of the first insulating layer.

The low-reflection inorganic layer may include ytterbium (Yb), cobalt (Co), molybdenum (M), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or one or more combinations thereof.

The first insulating layer may cover at least a part of a side surface of the opening of the light-shielding layer.

The display apparatus may further include a pixel-defining layer covering an edge of a pixel electrode of the display element and including an opening that exposes a central portion of the pixel electrode, wherein the pixel-defining layer includes a light-shielding material.

A side surface of the opening of the first insulating layer may be in contact with a side surface of the opening of the light-shielding layer.

A body portion of the first insulating layer and a body portion of the light-shielding layer may together include (e.g., form) a staircase-shaped step.

The display apparatus may further include a thin-film encapsulation layer on the low-reflection inorganic layer, and a touch sensing layer on the thin-film encapsulation layer, wherein the light-shielding layer is on the touch sensing layer.

According to one or more embodiments, a display apparatus includes a substrate, a first display element, a second display element, and a third display element on the substrate and configured to emit light of different colors, a low-reflection inorganic layer on all of the first display element, the second display element, and the third display element, a light-shielding layer on the low-reflection inorganic layer and including openings respectively corresponding to emission areas of the first display element, the second display element, and the third display element, a first insulating layer on the light-shielding layer and including openings respectively corresponding to the emission areas of the first, second, and third display elements, and a second insulating layer filling the openings of the light-shielding layer and the openings of the first insulating layer, wherein the first insulating layer includes a material configured to absorb light in a wavelength band of about 380 nm to about 500 nm, and a difference between a refractive index of the first insulating layer and a refractive index of the second insulating layer is from about 0.1 to about 0.2.

The light-shielding layer may be in black, and the first insulating layer may be in yellow.

The second insulating layer may selectively absorb light a first wavelength range and light in a second wavelength range of a visible light spectrum.

The low-reflection inorganic layer may include ytterbium (Yb), cobalt (Co), molybdenum (M), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or one or more combinations thereof.

The display apparatus may further include a pixel-defining layer covering an edge of each of a pixel electrode of the first display element, a pixel electrode of the second display element, and a pixel electrode of the third display element, the pixel-defining layer including openings respectively exposing central portions of the pixel electrodes of the first display element, the second display element, and the third display element, wherein the pixel-defining layer includes a light-shielding material.

The refractive index of the second insulating layer may be greater than the refractive index of the first insulating layer.

The first insulating layer may cover at least a part of a side surface of the openings of the light-shielding layer.

The display apparatus may further include a thin-film encapsulation layer on the low-reflection inorganic layer, and a touch sensing layer on the thin-film encapsulation layer, wherein the light-shielding layer is on the touch sensing layer.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
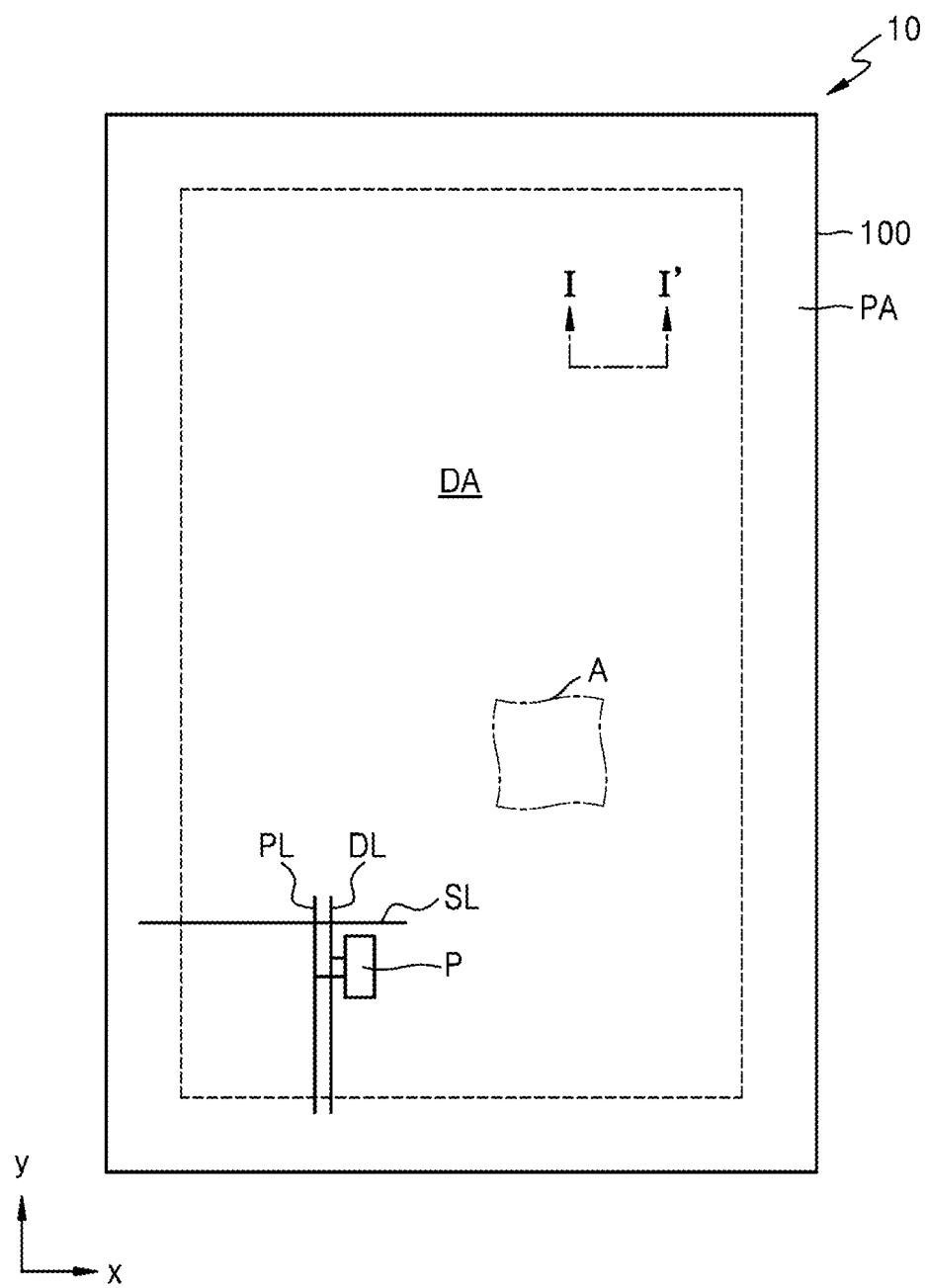
FIG. 1 is a plan view schematically illustrating a display apparatus according to one or more embodiments.

Reference will now be made in more detail to embodiments, examples of which are illustrated in the accompanying drawings, wherein like reference numerals refer to like elements throughout, and duplicative descriptions thereof may not be provided in the present disclosure. In this regard, the embodiments of the present disclosure may have different forms and should not be construed as being limited to the descriptions set forth herein. Accordingly, the embodiments are merely described, by referring to the drawings, to explain aspects of the description of the present disclosure. As utilized herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the present disclosure, the expression "at least one of a, b or c" indicates only a, only b, only c, both (e.g., simultaneously) a and b, both (e.g., simultaneously) a and c, both (e.g., simultaneously) b and c, all of a, b, and c, or any variations thereof. Further, the use of "may" when describing embodiments of the present disclosure refers to "one or more embodiments of the present disclosure".

The present disclosure may, however, be embodied in many different forms and should not be construed as being limited to the embodiments set forth herein. Effects and features of the present disclosure, and methods for achieving the same will be clarified with reference to embodiments described herein below in more detail with reference to the drawings. However, the embodiments of the present disclosure may be implemented in one or more suitable forms, not by being limited to the embodiments presented.

Hereinafter, embodiments will be described with reference to the accompanying drawings, wherein like reference symbols refer to like elements throughout the present disclosure, and duplicative descriptions thereof may not be provided.

In one or more embodiments, terms such as "first" and "second" are used herein merely to describe a variety of constituent elements, but the constituent elements are not limited by the terms. Such terms are used only for the purpose of distinguishing one constituent element from another constituent element. Thus, a first element could be termed a second element without departing from the teachings of the present invention. Similarly, a second element could be termed a first element.

In one or more embodiments, an expression used in the singular encompasses the expression of the plural, unless it has a clearly different meaning in the context.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, for example, intervening layers, regions, or components may be present.

In the drawings, sizes of components in the drawings may be exaggerated or reduced for convenience of explanation. In other words, because sizes and thicknesses of components in the drawings are arbitrarily illustrated for convenience of description, the following embodiments are not limited thereto.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular or normal to one another, or may represent different directions that are not perpendicular or normal to one another.

In the present specification, "A and/or B" refers to A or B, or A and B.

As used herein, the terms "use," "using," and "used" may be considered synonymous with the terms "utilize," "utilizing," and "utilized," respectively.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

FIG. 1 is a plan view schematically illustrating a display apparatus 10 according to one or more embodiments.

Referring to FIG. 1, a substrate 100 of the display apparatus 10 may be divided into a display area DA and a peripheral area PA around the display area DA. The display apparatus 10 may provide an image utilizing light emitted from a plurality of pixels P arranged in the display area DA.

Each of the pixels P includes a display element such as an organic light-emitting diode and/or an inorganic light-emitting diode, and may be to emit (e.g., may be configured to emit), for example, red, green, blue, and/or white light. For example, each of the pixels P may be connected (e.g., electrically coupled) to a pixel circuit including a thin-film transistor TFT, a capacitor, etc. The pixel circuit may be connected to a scan line SL and a data line DL and a driving voltage line PL crossing the scan line SL. The scan line SL may extend in an "x" direction, and each of the data line DL and the driving voltage line PL may extend in a "y" direction.

Each of the pixels P may be to emit (e.g., may be configured to emit) light by driving of the pixel circuit, and the display area DA may provide an image through (with) the light emitted from the pixels P. The pixel P described herein may be defined as an emission area in which light of any one color selected from among red, green, blue, and white is emitted, as described above.

The peripheral area PA is an area in which the pixels P are not arranged, and may not provide an image. A printed circuit board including a built-in driving circuit unit for driving the pixels P, a power supply line, and a driving circuit unit or a terminal unit to which a driver integrated circuit (IC) is connected may be arranged in the peripheral area PA.

The display apparatus 10 according to one or more embodiments may include an organic light-emitting display, an inorganic light-emitting display, a quantum dot display, etc. Hereinafter, the organic light-emitting display is described as an example of a display apparatus according to one or more embodiments. However, the display apparatus of the present disclosure is not limited thereto, and features to be described herein below may be applied to display apparatuses of one or more suitable types (or kinds).

Figure 2:
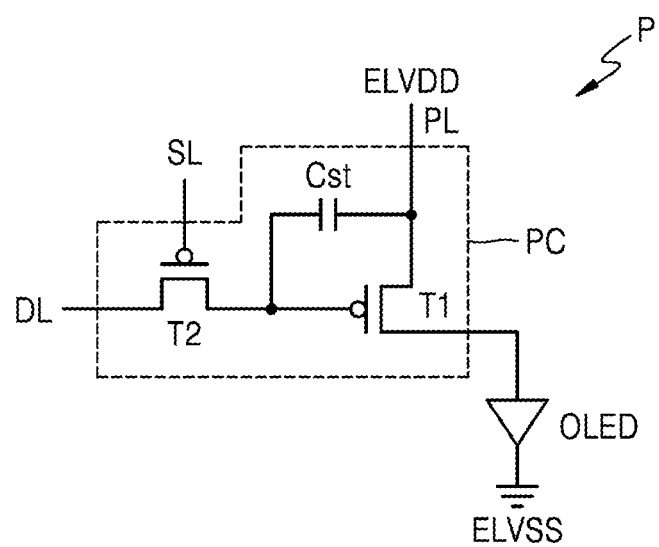
FIG. 2 is a circuit diagram of a display element provided in any one pixel of a display apparatus and a pixel circuit connected to the display element, according to one or more embodiments.

FIG. 2 illustrates a circuit diagram of a display element provided in any one pixel P of a display apparatus and a pixel circuit PC connected to the display element, according to one or more embodiments.

Referring to FIG. 2, an organic light-emitting diode OLED, which is a display element, may be connected to the pixel circuit PC. The pixel circuit PC may include a first thin-film transistor T1, a second thin-film transistor T2, and a storage capacitor Cst. For example, the organic light-emitting diode OLED may be to emit (e.g., may be configured to emit) one of red, green, and/or blue light, and/or one of red, green, blue, and/or white light.

The second thin-film transistor T2, which is a switching thin-film transistor, may be connected to the scan line SL and the data line DL, and may transfer a data voltage received via the data line DL to the first thin-film transistor T1 according to a switching voltage received via the scan line SL. The storage capacitor Cst is connected the second thin-film transistor T2 and the driving voltage line PL and may store a voltage corresponding to a voltage difference between a voltage applied via the second thin-film transistor T2 and a first power voltage ELVDD.

The first thin-film transistor T1, which is a driving thin-film transistor, is connected to the driving voltage line PL and the storage capacitor Cst, and may control a driving current flowing through the organic light-emitting diode OLED from the driving voltage line PL to correspond to the voltage stored in the storage capacitor Cst. The organic light-emitting diode OLED may be to emit (e.g., may be configured to emit) light having a set luminance by (e.g., based on) a driving current. An opposite electrode (e.g., a cathode) of the organic light-emitting diode OLED may receive a second power voltage ELVSS.

In FIG. 2, the pixel circuit PC includes two thin-film transistors and one storage capacitor. However, in one or more other embodiments, the number of thin-film transistors and the number of storage capacitors may be variously suitably modified according to a design of the pixel circuit PC.

Figure 3:
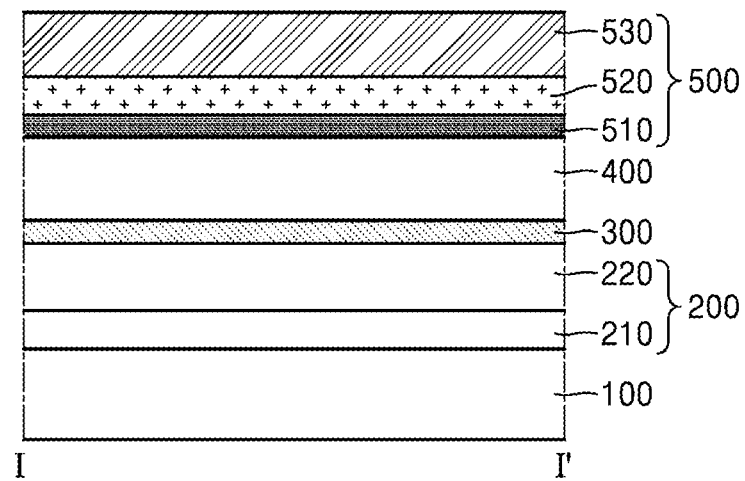
FIG. 3 is a cross-sectional view of the display apparatus of FIG. 1 according to one or more embodiments, taken along line I-I' of FIG. 1.

FIG. 3 is a cross-sectional view schematically illustrating the display apparatus of FIG. 1 according to one or more embodiments, taken along line I-I' of FIG. 1.

Referring to FIG. 3, in the display apparatus 10 according to one or more embodiments, a display layer 200 may be arranged on the substrate 100, and a low-reflection inorganic layer 300, a thin-film encapsulation layer 400, and an optical layer 500 may be arranged on the display layer 200.

The substrate 100 may include a polymer resin and/or a glass material. The substrate 100 including the polymer resin may be flexible, rollable, and/or bendable. The display layer 200 may include a display element layer 220 including a plurality of display elements and a pixel circuit layer 210 including pixel circuits respectively connected to the plurality of display elements. Each of the display elements provided in the display element layer 220 may define a pixel, and the pixel circuit layer 210 may include a plurality of transistors and a plurality of storage capacitors.

The low-reflection inorganic layer 300 may be arranged on the display layer 200. The low-reflection inorganic layer 300 may absorb (e.g., may be configured to absorb) light reflected by metals (e.g., metal-containing materials) arranged in the display apparatus 10, for example, in the display layer 200. In some embodiments, the low-reflection inorganic layer 300 may absorb light incident from outside of the display apparatus, thereby reducing external light reflectance. The low-reflection inorganic layer 300 may include an inorganic material having low reflectance.

The thin-film encapsulation layer 400 may be arranged on the low-reflection inorganic layer 300. The thin-film encapsulation layer 400 may prevent or reduce damage to the display elements by external foreign materials such as moisture. The thin-film encapsulation layer 400 may include at least one inorganic thin-film encapsulation layer and at least one organic thin-film encapsulation layer.

The optical layer 500 may be arranged on the thin-film encapsulation layer 400. The optical layer 500 may include an element for reducing reflectance of light (e.g., external light) incident toward the display apparatus 10 from the outside and improving light emission efficiency of light emitted by the display elements.

The optical layer 500 may include a light-shielding layer 510 including a black matrix, a first insulating layer 520, and a second insulating layer 530. The light-shielding layer 510 may block or reduce most light in a visible ray area (e.g., in the visible spectrum), and the first insulating layer 520 may block or reduce light with respect to some wavelengths. The first insulating layer 520 and the second insulating layer 530 may have different refractive indices from each other, to improve the optical performance of the display apparatus 10. The second insulating layer 530 may include a dye and/or a pigment, and may absorb (e.g., may be configured to absorb) light in a set or specific wavelength band. The second insulating layer 530 may include a reflection control layer for adjusting reflection of light.

A cover window may be arranged on the optical layer 500. The cover window may be attached onto the optical layer 500 by utilizing a transparent adhesive member such as an optically clear adhesive film.

Figure 4A:
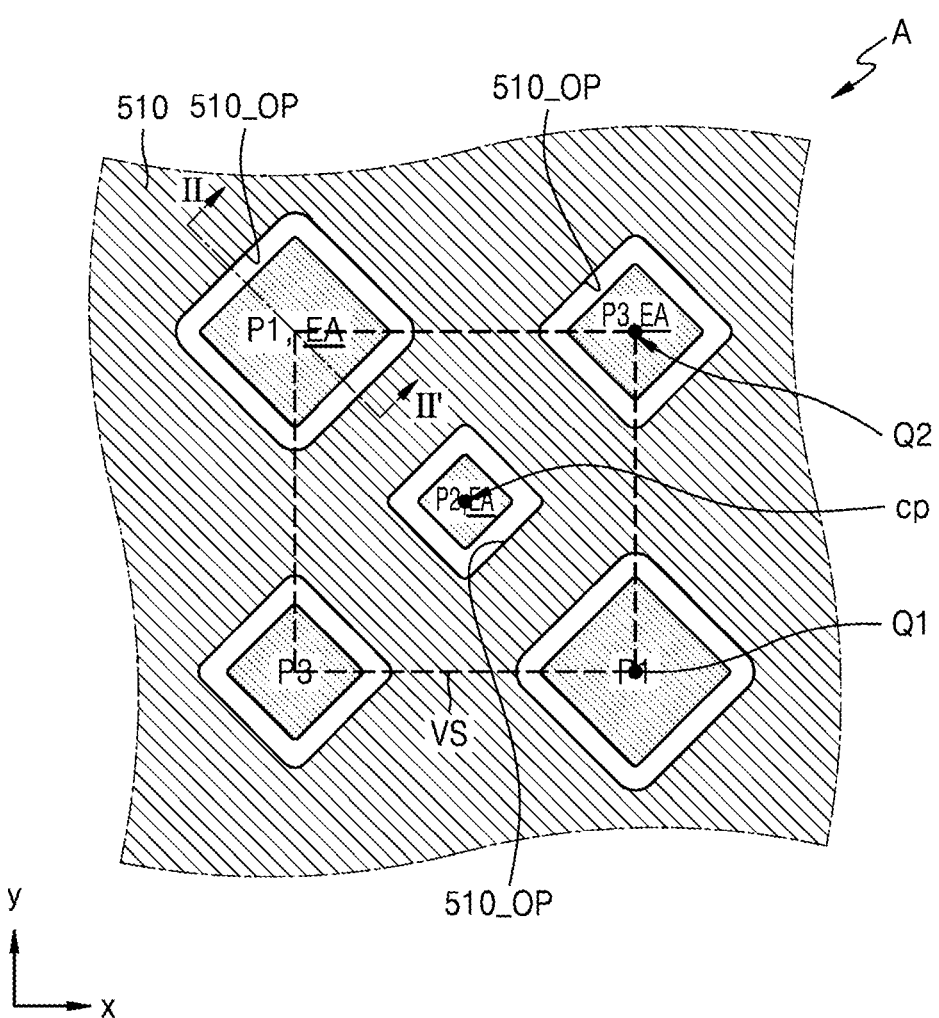
FIGS. 4A and 4B are enlarged plan views of some elements that may be included in region A of FIG. 1, according to one or more embodiments.
Figure 4B:
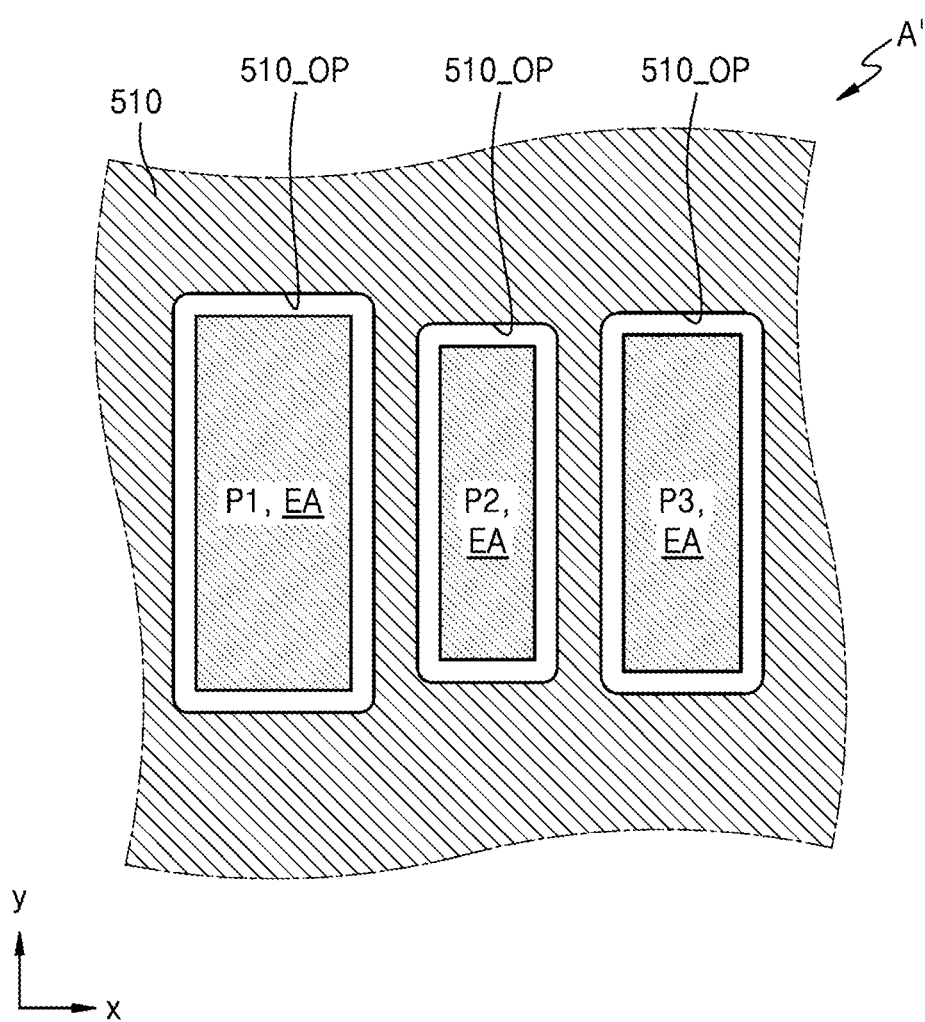

FIGS. 4A and 4B are enlarged plan views of some elements that may be included in region A of FIG. 1, according to one or more embodiments, and schematically illustrates an arrangement relationship between a plurality of pixels and an opening 510_OP of the light-shielding layer 510 which is arranged to correspond to an emission area EA of each of the pixels.

Referring to FIG. 4A, the display apparatus may include a plurality of pixels, and the plurality of pixels may include a first pixel P1, a second pixel P2, and a third pixel P3 emitting (e.g., configured to emit) light of different colors from each other. For example, the first pixel P1 may be to emit blue light, the second pixel P2 may be to emit green light, and the third pixel P3 may be to emit red light. However, the present disclosure is not limited thereto. For example, the first pixel P1 may be to emit red light, the second pixel P2 may be to emit green light, the third pixel P3 may be to emit blue light, and one or more suitable modifications may be made.

Each of the first pixel P1, the second pixel P2, and the third pixel P3 may have a quadrangular shape from among polygonal shapes. In the present disclosure, polygonal and quadrangular shapes also may include rounded vertices. For example, each of the first pixel P1, the second pixel P2, and the third pixel P3 may have a quadrangular shape with rounded vertices. In one or more embodiments, each of the first pixel P1, the second pixel P2, and the third pixel P3 may have a circular or elliptical shape.

The first pixel P1, the second pixel P2, and the third pixel P3 may have different sizes from each other. For example, an area of the second pixel P2 may be less than an area of the first pixel P1 and an area of the third pixel P3, and the area of the first pixel P1 may be greater than the area of the third pixel P3. However, the present disclosure is not limited thereto. The first pixel P1, the second pixel P2, and the third pixel P3 may have substantially the same size as each other, and one or more suitable modifications may be made.

Figure 5:
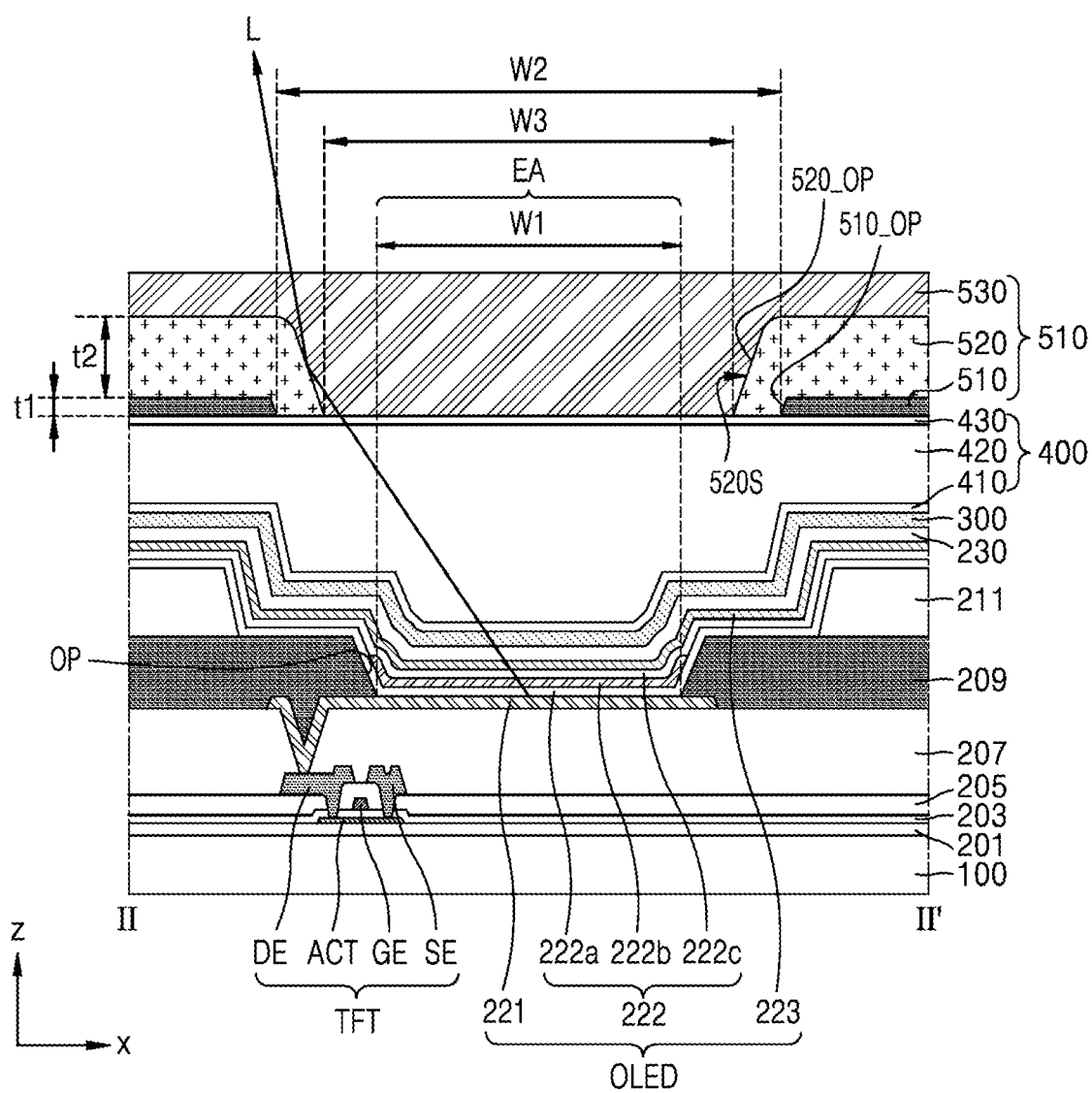
FIG. 5 is a schematic cross-sectional view of the display apparatus of FIG. 4A according to one or more embodiments, taken along line II-II' of FIG. 4A.

In the present disclosure, a size of each of the first pixel P1, the second pixel P2, and the third pixel P3 may refer to a size of an emission area EA of a display element implementing each pixel, and the emission area EA may be defined by an opening OP of a pixel-defining layer 209 (see FIG. 5).

In some embodiments, the light-shielding layer 510 arranged above the display element layer may include the opening 510_OP corresponding to each of the first to third pixels P1 to P3. The opening 510_OP may be provided by removing a portion of the light-shielding layer 510, and light emitted by the display element may be emitted to the outside through the opening 510_OP. A body of the light-shielding layer 510 may include a material that absorbs or reduces external light, and thus, the visibility of the display apparatus may be improved.

In a plan view, the opening 510_OP of the light-shielding layer 510 may be arranged to surround (e.g., enclose) each of the first, second, and third pixels P1, P2, and P3. In one or more embodiments, the opening 510_OP of the light-shielding layer 510 may have a quadrangular shape with rounded corners. Areas of the openings 510_OP of the light-shielding layer respectively corresponding to the first, second, and third pixels P1, P2, and P3 may be greater than areas of the first, second, and third pixels P1, P2, and P3, respectively. However, the present disclosure is not limited thereto. An area of each of the openings 510_OP of the light-shielding layer 510 may be substantially the same as an area of each of the corresponding first, second, and third pixels P1, P2, and P3.

The first pixel P1, the second pixel P2, and the third pixel P3 may be arranged in a pixel arrangement having a Pen-Tile® structure (PENTILE® is a registered trademark owned by Samsung Display Co., Ltd.). For example, in the first pixel P1, the second pixel P2, and the third pixel P3, the first pixel P1 may be arranged at a first vertex Q1 of a virtual quadrangle VS having the center point CP of the second pixel P2 as the center point thereof, and the third pixel P3 may be arranged at a second vertex Q2 of the virtual quadrangle VS. The quadrangle VS may include (e.g., may be) a square.

The first pixel P1 may be apart from the second pixel P2, and the center point of the first pixel P1 may be arranged at the first vertex Q1 of the virtual quadrangle VS. The first pixel P1 may be provided in plurality, and the plurality of first pixels P1 may be apart from each other with the second pixel P2 therebetween.

The third pixel P3 may be apart from the first pixel P1 and the second pixel P2, and the center point of the third pixel P3 may be arranged at the second vertex Q2 adjacent to the first vertex Q1 of the virtual quadrangle VS. The third pixel P3 may be provided in plurality, and the plurality of third pixels P3 may be apart from each other with the second pixel P2 therebetween.

The plurality of first pixels P1 and the plurality of third pixels P3 may be alternately arranged with each other in both an x-direction and a y-direction crossing the x-direction. The first pixel P1 may be surrounded by the plurality of second pixels P2 and the plurality of third pixels P3 (or the plurality of second pixels P2 and the plurality of third pixels P3 may surround or be around the first pixel P1).

In FIG. 4A, the first pixel P1, the second pixel P2, and the third pixel P3 are arranged in a PenTile® structure. However, the present disclosure is not limited thereto.

For example, the first pixel P1, the second pixel P2, and the third pixel P3 may be arranged in a stripe structure (e.g., stripe pattern). For example, the first pixel P1, the second pixel P2, and the third pixel P3 may be sequentially arranged in the x-direction. In another embodiment, the first pixel P1, the second pixel P2, and the third pixel P3 may be arranged in one or more suitable pixel arrangement structures such as a mosaic structure and/or a delta structure. The display apparatus according to the present disclosure includes the first pixel P1, the second pixel P2, and the third pixel P3 emitting (e.g., configured to emit) light of different colors from each other, and the light-shielding layer 510 may include the openings 510_OP respectively corresponding to the first, second, and third pixels P1, P2, and P3.

Hereinafter, the display apparatus according to one or more embodiments is described in more detail according to a stacked structure shown in FIG. 5.

FIG. 5 is a schematic cross-sectional view of the display apparatus of FIG. 4A according to one or more embodiments, taken along line II-II' of FIG. 4A.

Referring to FIG. 5, the display apparatus according to one or more embodiments includes an organic light-emitting diode OLED as a display element including an emission area EA above a substrate 100, a low-reflection inorganic layer 300, a thin-film encapsulation layer 400, a light-shielding layer 510 including an opening 510_OP, a first insulating layer 520 including an opening 520_OP, and a second insulating layer 530 filling the opening 520_OP. In one or more embodiments, the display apparatus may further include a capping layer 230 between the organic light-emitting diode OLED and the low-reflection inorganic layer 300.

The substrate 100 may be a single glass layer. In some embodiments, the substrate 100 may include a polymer resin. The substrate 100 including the polymer resin may have a structure in which a layer including a polymer resin and an inorganic layer are stacked. In one or more embodiments, the substrate 100 may include a polymer resin such as polyethersulfone, polyarylate, polyetherimide, polyethylene naphthalate, polyethylene terephthalate, polyphenylene sulfide, polyimide, polycarbonate, cellulose triacetate, or/and cellulose acetate propionate, and may be flexible. The substrate 100 may include glass having silicon oxide ($SiO_2$) as a main component and/or a resin such as reinforced plastic, and may be rigid.

A thin-film transistor TFT may include a semiconductor layer ACT, a gate electrode GE, a source electrode SE, and a drain electrode DE, the semiconductor layer ACT including amorphous silicon, polycrystalline silicon, and/or a suitable organic semiconductor material. In order to ensure insulation between the semiconductor layer ACT and the gate electrode GE, a gate insulating layer 203 including an inorganic material such as silicon oxide, silicon nitride, and/or silicon oxynitride may be between the semiconductor layer ACT and the gate electrode GE. Further, an interlayer insulating layer 205 including an inorganic material such as silicon oxide, silicon nitride, and/or silicon oxynitride may be arranged on the gate electrode GE, and the source electrode SE and the drain electrode DE may be arranged on the interlayer insulating layer 205 described above. An insulating layer including an inorganic material may be provided by chemical vapor deposition (CVD) and/or atomic layer deposition (ALD).

The gate electrode GE, the source electrode SE, and the drain electrode DE may include one or more suitable conductive materials. The gate electrode GE may include at least one of molybdenum, aluminum, copper, or titanium, and may have a multi-layer structure when necessary. For example, the gate electrode GE may have a single molybdenum layer, or may have a three-layer structure including a molybdenum layer, an aluminum layer, and another molybdenum layer. Each of the source electrode SE and the drain electrode DE may include at least one of copper, titanium, or aluminum, and may have a multi-layer structure when necessary. For example, each of the source electrode SE and the drain electrode DE may have a three-layer structure including a titanium layer, an aluminum layer, and a titanium layer.

A buffer layer 201 including an inorganic material such as silicon oxide, silicon nitride, and/or silicon oxynitride may be between the thin-film transistor TFT having the above-described structure and the substrate 100. The buffer layer 201 may increase the smoothness of an upper surface of the substrate 100 and/or may prevent, minimize, or reduce penetration of impurities from the substrate 100 and/or the like into the semiconductor layer ACT of the thin-film transistor TFT.

A planarization insulating layer 207 may be arranged on the thin-film transistor TFT. For example, the planarization insulating layer 207 may include an inorganic material such as acryl, benzocyclobutene (BCB), and/or hexamethyldisiloxane (HMDSO). In FIG. 5, the planarization insulating layer 207 is shown as a single layer, but may be a multi-layer.

A pixel electrode 221 may be arranged on the planarization insulating layer 207. The pixel electrode 221 may be arranged for each pixel. The pixel electrodes 221 respectively corresponding to adjacent pixels may be arranged apart from each other.

The pixel electrode 221 may be a reflective electrode. In some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or any compound thereof, and a transparent or semi-transparent electrode layer provided on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 221 may have a three-layer structure of an ITO layer, an Ag layer, and another ITO layer.

The pixel-defining layer 209 may be arranged on the pixel electrode 221. The pixel-defining layer 209 may have an opening OP exposing a central portion of each of the pixel electrodes 221. The pixel-defining layer 209 may cover an edge of the pixel electrode 221, and prevent or reduce an arc and/or the like from occurring at the edge of the pixel electrode 221 by increasing a distance between the edge of the pixel-defining layer 209 and an opposite electrode 223. The pixel-defining layer 209 may include an organic insulating layer such as polyimide, polyamide, acrylic resin, BCB, HMDSO, and/or phenolic resin, and may be formed by spin coating and/or the like. In some embodiments, the pixel-defining layer 209 may include an inorganic insulating material. In some embodiments, the pixel-defining layer 209 may have a multi-layer including an inorganic insulating material and an organic insulating material.

In some embodiments, the pixel-defining layer 209 may include a light-shielding material, and may be provided in black. The light-shielding material may include carbon black, carbon nanotubes, a resin or paste including a black dye, metal particles (for example, Ni, Al, molybdenum, and/or any alloy thereof), metal oxide particles (for example, a chromium oxide), and/or metal nitride particles (for example, a chromium nitride). When the pixel-defining layer 209 includes a light-shielding material, external reflection due to metal (e.g., metal-containing) structures arranged below the pixel-defining layer 209 may be reduced.

A spacer 211 may be arranged on the pixel-defining layer 209. The spacer 211 may prevent or reduce the layers between one spacer (e.g., a spacer on the left) 211 and another spacer (e.g., a spacer on the right) 211 from being damaged by a mask utilized in a process of forming an emission layer 222b to be described herein below. The spacer 211 may include the same material as the pixel-defining layer 209. In some embodiments, the spacer 211 may include a light-shielding material.

The emission layer 222b may be arranged in the opening OP of the pixel-defining layer 209. The emission layer 222b may include an organic material including a fluorescent and/or phosphorescent material capable of emitting red, green, and/or blue light. The organic material described above may include a low-molecular weight organic material and/or a polymer organic material. In other embodiments, the emission layer 222b may include an inorganic material. For example, the emission layer 222b may include an inorganic material including quantum dots. The quantum dots may include a nano semiconductor compound including Group II-VI, Group III-V, Group IV-VI, and/or Group I-III-VI compound. For example, the quantum dots may be selected from among a Group II-VI semiconductor compound such as cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), and/or mercury telluride (HgTe); a Group III-V semiconductor compound such as gallium phosphide (GaP), gallium arsenide (GaAs), gallium antimonide (GaSb), indium phosphide (InP), indium arsenide (InAs), indium antimonide (InSb), cadmium sulfide selenide (CdSSe), cadmium selenium telluride (CdSeTe), and/or zinc cadmium selenide (ZnCdSe); a Group IV-VI semiconductor compound such as lead sulfide (PbS), lead selenide (PbSe), and/or lead telluride (PbTe); and a Group I-III-VI semiconductor compound such as silver gallium sulphide (AgGaS2), silver gallium selenide (AgGaSe2), silver gallium telluride (AgGaTe2), silver indium sulfide (AgInS2), copper indium sulfide (CuInS2), copper indium selenide (CuInSe2), copper gallium sulfide (CuGaS2), and/or copper gallium selenide (CuGaSe2). The quantum dots may have a single-layer structure of any of the semiconductor compounds listed above, and may have a core-shell structure. The core is a portion where substantial emission occurs, and an emission wavelength of the quantum dots is controlled or selected according to a size and/or component of the core. The shell promotes a quantum confinement effect of the core and protects the quantum dots from heat, moisture, and/or oxygen. In some embodiments, the shell may be a single layer, or may be formed in a multi-layer structure when necessary.

A first common layer 222a and a second common layer 222c may be arranged below and above the emission layer 222b, respectively. The first common layer 222a may include, for example, a hole transport layer (HTL), or may include a hole transport layer and a hole injection layer (HIL). The second common layer 222c is a component arranged on the emission layer 222b and may include an electron transport layer (ETL) and/or an electron injection layer (EIL). The second common layer 222c is optional. In some embodiments, the second common layer 222c may not be provided.

While the emission layer 222b is arranged for each pixel to correspond to the opening OP of the pixel-defining layer 209, the first common layer 222a and the second common layer 222c may be common layers integrally formed as a single body to cover the entire substrate 100, for example, to cover the entire display area of the substrate 100 akin to an opposite electrode 223 to be described herein below.

The opposite electrode 223 may be a cathode that is an electron injection electrode. In this case, a metal having a low work function, an alloy, an electrically conductive compound, or one or more combinations thereof may be utilized as a material for the opposite electrode 223. The opposite electrode 223 may be a transmissive electrode, a transflective electrode, or a reflective electrode.

The opposite electrode 223 may include lithium (Li), Ag, Mg, Al, aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The opposite electrode 223 may have a single-layer structure or a multi-layer structure.

The capping layer 230 may improve the external light emission efficiency of an organic light-emitting device by the principle of constructive interference. The capping layer 230 may include a material having a refractive index (at 589 nm) of about 1.6 or more. The capping layer 230 may have a thickness of about 1 nm to about 200 nm, for example, about 5 nm to about 150 nm, or about 10 nm to about 100 nm.

The capping layer 230 may include an organic capping layer including an organic material, an inorganic capping layer including an inorganic material, or a composite capping layer including an organic material and an inorganic material.

For example, the capping layer 230 may include a carbocyclic compound, a heterocyclic compound, an amine group-containing compound, porphine derivative(s), phthalocyanine derivative(s), naphthalocyanine derivative(s), alkali metal complex(es), alkaline earth metal complex(es), or one or more combinations thereof. The carbocyclic compounds, heterocyclic compounds, and amine group-containing compounds may each independently be selectively substituted with a substituent including oxygen (O), nitrogen (N), sulfur (S), selenium (Se), silicon (Si), fluorine (F), chlorine (Cl), bromine (Br), iodine (I), or one or more combinations thereof.

The low-reflection inorganic layer 300 may be arranged on the capping layer 230. The low-reflection inorganic layer 300 may include an inorganic material having low reflectance. The low-reflection inorganic layer 300 may include Yb, cobalt (Co), molybdenum (Mo), titanium (Ti), zirconium (Zr), Al, Cr, niobium (Nb), Pt, tungsten (W), indium (In), tin (Sn), iron (Fe), Ni, tantalum (Ta), manganese (Mn), zinc (Zn), germanium (Ge), or one or more combinations thereof. The low-reflection inorganic layer 300 may be formed by thermally depositing the inorganic material.

An inorganic material included in the low-reflection inorganic layer 300 may have an absorption coefficient of about 0.3 or more. In one or more embodiments, the inorganic material included in the low-reflection inorganic layer 300 may have a refractive index of about 1 or more.

The low-reflection inorganic layer 300 absorbs or reduces light incident into the display apparatus and induces destructive interference between metals of openings, so that light propagating toward the outside of the display apparatus, that is, external light reflectance of the display apparatus may be reduced or blocked, and thus, display quality and visibility may be improved.

In one or more embodiments, the low-reflection inorganic layer 300 may have a thickness of about 0.1 nm to about 50 nm, for example, about 0.5 nm to about 30 nm, or about 1 nm to about 20 nm.

The thin-film encapsulation layer 400 may be arranged on the low-reflection inorganic layer 300. The thin-film encapsulation layer 400 may include at least one inorganic encapsulation layer and at least one organic encapsulation layer. For example, the thin-film encapsulation layer 400 may include a first inorganic encapsulation layer 410, an organic encapsulation layer 420, and a second inorganic encapsulation layer 430, as shown in FIG. 5.

Each of the first inorganic encapsulation layer 410 and the second inorganic encapsulation layer 430 may include at least one inorganic insulating material selected from among aluminum oxide, titanium oxide, tantalum oxide, hafnium oxide, zinc oxide, silicon oxide, silicon nitride, and silicon oxynitride. Each of the first inorganic encapsulation layer 410 and the second inorganic encapsulation layer 430 may have a single-layer or a multi-layer structure including the above-described inorganic insulating material.

The organic encapsulation layer 420 may relieve internal stress of the first inorganic encapsulation layer 410 and/or the second inorganic encapsulation layer 430. The organic encapsulation layer 420 may include a polymer-based material. The polymer-based material may include polyethylene terephthalate, polyethylene naphthalate, polycarbonate, polyimide, polyethylene sulfonate, polyoxymethylene, polyarylate, HMDSO, acryl-based resin (e.g., poly(methyl methacrylate), polyacrylic acid, etc.), or one or more combinations thereof.

The organic encapsulation layer 420 may be formed by applying a monomer having flowability and then curing the monomer layer utilizing light such as heat and/or ultraviolet rays. In some embodiments, the organic encapsulation layer 420 may be formed by applying the above-described polymer-based material.

Even when cracks occur in the thin-film encapsulation layer 400 through the above-described multi-layer structure, the thin-film encapsulation layer 400 may prevent or reduce a connection of such cracks between the first inorganic encapsulation layer 410 and the organic encapsulation layer 420 and/or between the organic encapsulation layer 420 and the second inorganic encapsulation layer 430. Through this, the formation of a path (e.g., a complete path) through which moisture and/or oxygen from the outside penetrates into the display area DA may be prevented, minimized, or reduced.

The light-shielding layer 510 may be arranged on the thin-film encapsulation layer 400. The optical layer 500 may include the light-shielding layer 510, the first insulating layer 520, and the second insulating layer 530. In the present embodiments, the light-shielding layer 510 may block or reduce most light in a visible light area, and the first insulating layer 520 may block or reduce light with respect to some wavelengths. For example, the light-shielding layer 510 and the first insulating layer 520 may have different wavelength spectrums for absorbing light.

The light-shielding layer 510 includes the opening 510_OP overlapping the emission area EA of the organic light-emitting diode OLED. The emission area EA may be defined by the opening OP of the pixel-defining layer 209. The first insulating layer 520 may have the opening 520_OP overlapping the emission area EA of the organic light-emitting diode OLED. The opening 510_OP of the light-shielding layer 510 may overlap the opening 520_OP of the first insulating layer 520.

In some embodiments, the opening 510_OP of the light-shielding layer 510 overlaps the opening OP of the pixel-defining layer 209, but a second width W2 (that is a width of the opening 510_OP of the light-shielding layer 510) may be provided to be greater than a first width W1 of the opening OP of the pixel-defining layer 209. In some embodiments, the second width W2 may be greater than the first width W1 by about 6 μm to about 10 μm. In a plan view, an edge of the opening 510_OP of the light-shielding layer 510 may be apart from an edge of the opening OP of the pixel-defining layer 209 by about 3 μm to about 5 μm outward.

In some embodiments, the opening 520_OP of the first insulating layer 520 overlaps the opening 510_OP of the light-shielding layer 510, but a third width W3 (that is a width of the opening 520_OP of the first insulating layer 520) may be provided to be less than the second width W2 of the opening 510_OP of the light-shielding layer 510. In this case, a body portion of the first insulating layer 520 may cover a side surface of the opening 510_OP of the light-shielding layer 510 and partially fill the opening 510_OP. Here, the body portion of the light-shielding layer 510 is a portion distinct from the opening 510_OP of the light-shielding layer 510, and refers to a portion having a set or certain volume. For example, the first insulating layer 520 may cover at least a portion of the side surface of the opening 510_OP of the light-shielding layer 510.

In some embodiments, the opening 520_OP of the first insulating layer 520 overlaps the opening OP of the pixel-defining layer 209, but the third width W3 (that is the width of the opening 520_OP of the first insulating layer 520) may be provided to be greater than the first width W1 (that is the width of the opening OP of the pixel-defining layer 209). In some embodiments, the third width W3 may be greater than the first width W1 by about 2 μm to about 4 μm. In a plan view, an edge of the opening 520_OP of the first insulating layer 520 may be apart from the edge of the opening OP of the pixel-defining layer 209 by about 2 μm to about 4 μm outward.

A body portion of the light-shielding layer 510 provided with the opening 510_OP may overlap a body portion of the pixel-defining layer 209. For example, the body portion of the light-shielding layer 510 may overlap only the body portion of the pixel-defining layer 209. The body portion of the light-shielding layer 510 is a portion distinct from the opening 510_OP of the light-shielding layer 510, and refers to a portion having a set or certain volume. Similarly, the body portion of the pixel-defining layer 209 is distinct from the opening OP of the pixel-defining layer 209, and refers to a portion having a set or certain volume. The body portion of the first insulating layer 520 provided with the opening 520_OP may overlap the body portion of the light-shielding layer 510 and the body portion of the pixel-defining layer 209.

A second thickness t2 (that is a thickness of the body portion of the first insulating layer 520) may be greater than a first thickness t1 (which is a thickness of the body portion of the light-shielding layer 510). In some embodiments, the second thickness t2 may be from about 2 to about 5 times greater than the first thickness t1. For example, the first thickness t1 may be in a range from about 1 μm to about 1.5 μm, and the second thickness t2 may be in a range from about 2.5 μm to about 5 μm. This may be so that light emitted by the display element reaches a side surface of the opening 520_OP of the first insulating layer 520 and is refracted. Here, the second thickness t2 may refer to a thickness from an upper surface of the light-shielding layer 510 to an upper surface of the first insulating layer 520.

The light-shielding layer 510 may have a wavelength spectrum that may absorb light in a visible ray band (e.g., visible light band), for example, in a wavelength of about 380 nm to about 780 nm. The light-shielding layer 510 may be provided in black. For example, the light-shielding layer 510 may include carbon black, carbon nanotubes, a resin and/or paste containing black dye, metal particles such as Ni, Al, Mo, and/or one or more alloys thereof, metal oxide particles (e.g., a chromium oxide), and/or metal nitride particles (e.g., a chromium nitride).

The first insulating layer 520 may have a wavelength spectrum capable of absorbing light in a wavelength of a blue light band, for example, a wavelength of about 380 nm to about 500 nm. In some embodiments, the first insulating layer 520 may have a transmittance of about 0.5% or less for light in a wavelength band of about 400 nm to 490 nm.

The first insulating layer 520 may be provided in yellow (e.g., yellow in color). For example, the first insulating layer 520 may include a material capable of absorbing light in a wavelength of about 380 nm to about 500 nm. For example, the first insulating layer 520 may include a resin and/or paste including a yellow dye and/or pigment. Quinophthalone may be included as the yellow pigment included in the first insulating layer 520. In some embodiments, the first insulating layer 520 may further include a polymer binder, a cross-linker, a photo-initiator, and/or a solvent.

When an absorption rate of light in a lower wavelength band among visible light bands is increased, neutral black may be implemented. In the present embodiments, the light-shielding layer 510 may absorb light having a wavelength in the visible ray band (e.g., visible light band or visible light spectrum), and the first insulating layer 520 may additionally absorb light in a low wavelength band with high reflectance, for example, a blue ray band. Accordingly, a color expressed by the light-shielding layer 510 and the first insulating layer 520 may be implemented as neutral black, thereby further reducing the reflectance of external light.

The second insulating layer 530 may be arranged on the first insulating layer 520 and may fill the opening 520_OP of the first insulating layer 520. For example, the second insulating layer 530 may completely (e.g., entirely) fill the opening 520_OP of the first insulating layer 520. In some embodiments, the second insulating layer 530 may fill the opening 510_OP of the light-shielding layer 510. The second insulating layer 530 may be arranged on the thin-film encapsulation layer 400 and on the body portion of the first insulating layer 520.

The second insulating layer 530 includes a substantially flat upper surface, and a portion of the second insulating layer 530 overlapping the opening 520_OP may have a thickness greater than that of another portion (e.g., a portion overlapping the upper surface (e.g., the body portion) of the first insulating layer 520). The second insulating layer 530 may directly contact a side surface 520S and the upper surface of the first insulating layer 520 defining the opening 520_OP.

The second insulating layer 530 may be provided such that a refractive index of the second insulating layer 530 has a difference about 0.1 to about 0.2 from that of the first insulating layer 520. In some embodiments, the second insulating layer 530 may include a material having a higher refractive index than that of the first insulating layer 520, and the first insulating layer 520 may include a material having a low refractive index. In other embodiments, the first insulating layer 520 may include a material having a higher refractive index than that of the second insulating layer 530, and the second insulating layer 530 may include a material having a low refractive index.

When the refractive indices of the first insulating layer 520 and the second insulating layer 530 are different from each other, light L emitted by the organic light-emitting diode OLED and traveling in an oblique direction with respect to a direction (z-direction) perpendicular (e.g., substantially perpendicular or normal) to the upper surface of the substrate 100 may be totally reflected, or refracted at the side surface 520S of the first insulating layer 520, to travel to the outside of the display apparatus, and thus, light output efficiency of the organic light-emitting diode OLED may be improved and luminance may be increased.

In some embodiments, a refractive index of a low refractive index material that may be utilized for the first insulating layer 520 and/or the second insulating layer 530 may range from about 1.4 to about 1.6. The low refractive index material may include, for example, acryl-based resin (for example, poly(methyl methacrylate), polyacrylic acid, etc.), ethylhexyl acrylate, pentafluoropropyl acrylate, poly(ethylene glycol) dimethacrylate, and/or ethylene glycol dimethacrylate.

In some embodiments, a refractive index of a high refractive index material that may be utilized for the first insulating layer 520 and/or the second insulating layer 530 may be in a range from about 1.6 to about 1.85. In some embodiments, dispersed particles for high refractive index may be included in the first insulating layer 520 and/or the second insulating layer 530 having a high refractive index. The dispersed particles may include metal oxide particles such as zinc oxide ($ZnO_x$), titanium oxide ($TiO_2$), zirconium oxide ($ZrO_2$), and/or barium titanate ($BaTiO_3$). The first insulating layer 520 and/or the second insulating layer 530 having the high refractive index of the present embodiments may be formed by applying an organic material containing metal oxide particles utilizing inkjet.

In some embodiments, the first insulating layer 520 and/or the second insulating layer 530 may further include a thermosetting agent such as epoxy and/or a photocuring agent.

The side surface 520S of the opening 520_OP of the first insulating layer 520 may include an inclined surface. An inclination angle of the side surface 520S may be from about (e.g., at least) 70 degrees to about 80 degrees. In this case, the inclination angle may be an angle formed between the side surface 520S and the upper surface of the thin-film encapsulation layer 400.

As the side surface 520S includes an inclined surface tapered in a forward direction (e.g., away from the opening 520_OP) with respect to the upper surface of the thin-film encapsulation layer 400, a width of the opening 520_OP may gradually increase as a distance from the side surface 520S (e.g., from the thin-film encapsulation layer 400) increases in a direction (z-direction) perpendicular (e.g., substantially perpendicular or normal) to the upper surface of the substrate 100. A width of an upper portion of the opening 520_OP of the first insulating layer 520 may be greater than a width of a lower portion thereof, and in this case, the third width W3, which is the width of the opening 520_OP described above, corresponds to the width of the lower portion of the opening 520_OP. In some embodiments, the first width W1 of the opening OP of the pixel-defining layer 209 also corresponds to the width of the lower portion of the opening OP of the pixel-defining layer 209, and the second width W2 of the opening 510_OP of the light-shielding layer 510 also corresponds to a lower portion of the opening 510_OP of the light-shielding layer 510.

The second insulating layer 530 may selectively absorb or reduce light having a wavelength of a partial band among light reflected from the inside of the display apparatus and/or light incident from the outside of the display apparatus.

Figure 6:
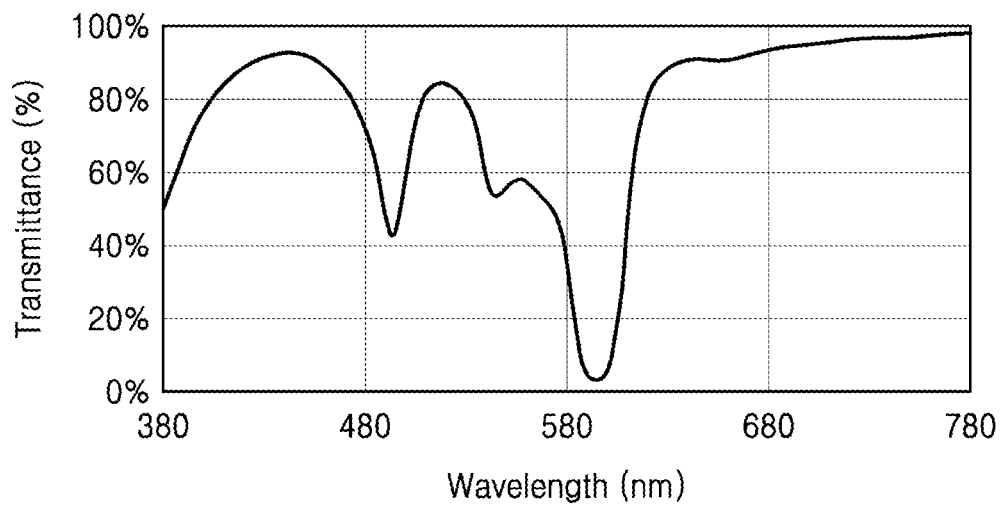
FIG. 6 shows light transmittance of a second insulating layer according to one or more embodiments.

FIG. 6 illustrates light transmittance of the second insulating layer 530 according to one or more embodiments. Referring to FIG. 6, the second insulating layer 530 may absorb light in a first wavelength range of about 480 nm to about 505 nm and light in a second wavelength range of about 585 nm to about 605 nm, and may have a light transmittance of about 50% or less in the first wavelength range and the second wavelength range. For example, the second insulating layer 530 may absorb (e.g., may be configured to absorb) light having a wavelength in a red, green, and/or blue emission wavelength range of the organic light-emitting diode OLED. The second insulating layer 530 may absorb more light in the second wavelength range than in the first wavelength range.

The second insulating layer 530 may be provided as an organic material layer including a dye, a pigment, or a combination thereof.

In one or more embodiments, the second insulating layer 530 may include an oxazine-based compound, a cyanine-based compound, a tetraazoporfin-based compound, and/or a squarylium-based compound.

For example, the second insulating layer 530 may include a compound represented by any one of Chemical Formulae 1 to 4:

Chemical Formula 1

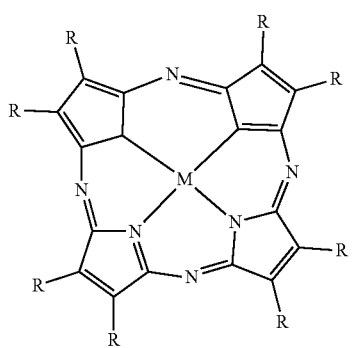

Chemical Formula 2

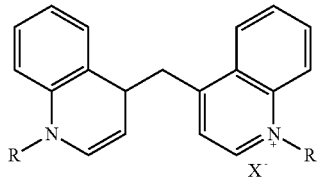

Chemical Formula 3

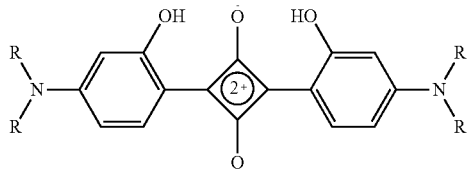

Chemical Formula 4

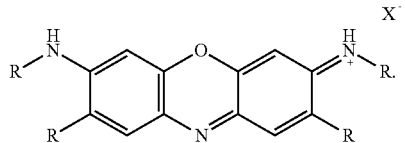

In Chemical Formulae 1 to 4,

M is a metal,

X— is a monovalent anion,

R may include hydrogen, deuterium (—D), —F, —Cl, —Br, —I, a hydroxyl group, a cyano group, or a nitro group;

$C_1$-$C_{60}$ alkyl group, $C_2$-$C_{60}$ alkynyl group, or $C_1$-$C_{60}$ alkoxy group each independently unsubstituted or substituted with deuterium, —F, —Cl, —Br, —I, hydroxyl group, cyano group, nitro group, $C_3$-$C_{60}$ carbocyclic group, $C_1$-$C_{60}$ heterocyclic group, $C_6$-$C_{60}$ aryloxy group, $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), or one or more combinations thereof;

$C_3$-$C_{60}$ carbocyclic group, $C_1$-$C_{60}$ heterocyclic group, $C_6$-$C_{60}$ aryloxy group, or $C_6$-$C_{60}$ arylthio group, each independently unsubstituted or substituted with deuterium, —F, —Cl, —Br, —I, hydroxyl group, cyano group, nitro group, $C_1$-$C_{60}$ alkyl group, $C_2$-$C_{60}$ alkenyl group, $C_2$-$C_{60}$ alkynyl group, $C_1$-$C_{60}$ alkoxy group, $C_3$-$C_{60}$ carbocyclic group, $C_1$-$C_{60}$ heterocyclic group, $C_6$-$C_{60}$ aryloxy group, $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); and a plurality of R(s) may be the same as or different from each other.

The $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; hydroxyl group; cyano group; nitro group; $C_1$-$C_{60}$ alkyl group; $C_2$-$C_{60}$ alkenyl group; $C_2$-$C_{60}$ alkynyl group; $C_1$-$C_{60}$ alkoxy group; or $C_3$-$C_{60}$ carbocyclic group or $C_1$-$C_{60}$ heterocyclic group each independently unsubstituted or substituted with deuterium, —F, cyano group, $C_1$-$C_{60}$ alkyl group, $C_1$-$C_{60}$ alkoxy group, phenyl group, biphenyl group, or one or more combinations thereof.

In one or more embodiments, X— may be a halide ion, a carboxylate ion, a nitrate ion, a sulfonate ion, or a bisulfate ion.

For example, X— may be F—, Cl—, Br—, I—, $CH_3COO$—, $NO_3$—, $HSO_4$—, propionate ion, benzene sulfonate ion, and/or the like.

In one or more embodiments, a reflectance measured in a specular component included (SCI) mode on a surface of the second insulating layer 530 may be from about 10% or less. For example, the second insulating layer 530 may absorb external light reflection of the display apparatus to improve visibility.

The display apparatus according to the present embodiments may not utilize a polarizing film or a color filter to reduce external light reflection, but may instead introduce the low-reflection inorganic layer 300 and the second insulating layer 530.

When the polarizing film is utilized to reduce external light reflection, transmittance of light emitted by an organic light-emitting diode OLED may also be significantly (e.g., undesirably) reduced by the polarizing film. When a color filter corresponding to a color of each pixel is utilized to reduce external light reflection, reflective color bands may occur according to different light reflectances for each pixel, and process costs may increase due to the number of process steps.

The display apparatus according to the present embodiments introduces the low-reflection inorganic layer 300 and the second insulating layer 530 that are commonly (e.g., integrally) applied to each pixel, thereby increasing light transmittance and reducing external light reflection.

Figure 7:
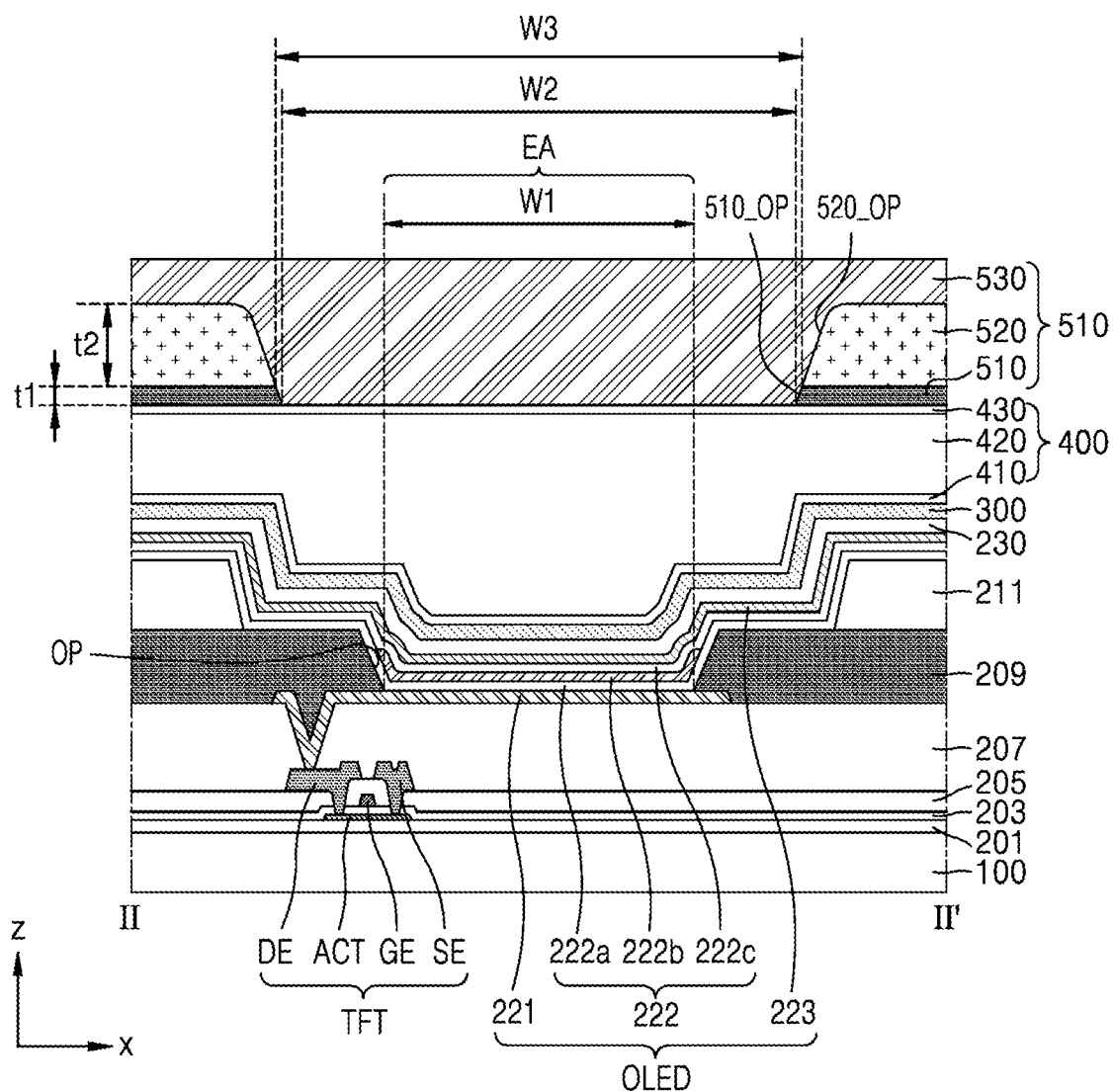
FIG. 7 is a cross-sectional view of a display apparatus according to one or more embodiments.
Figure 8:
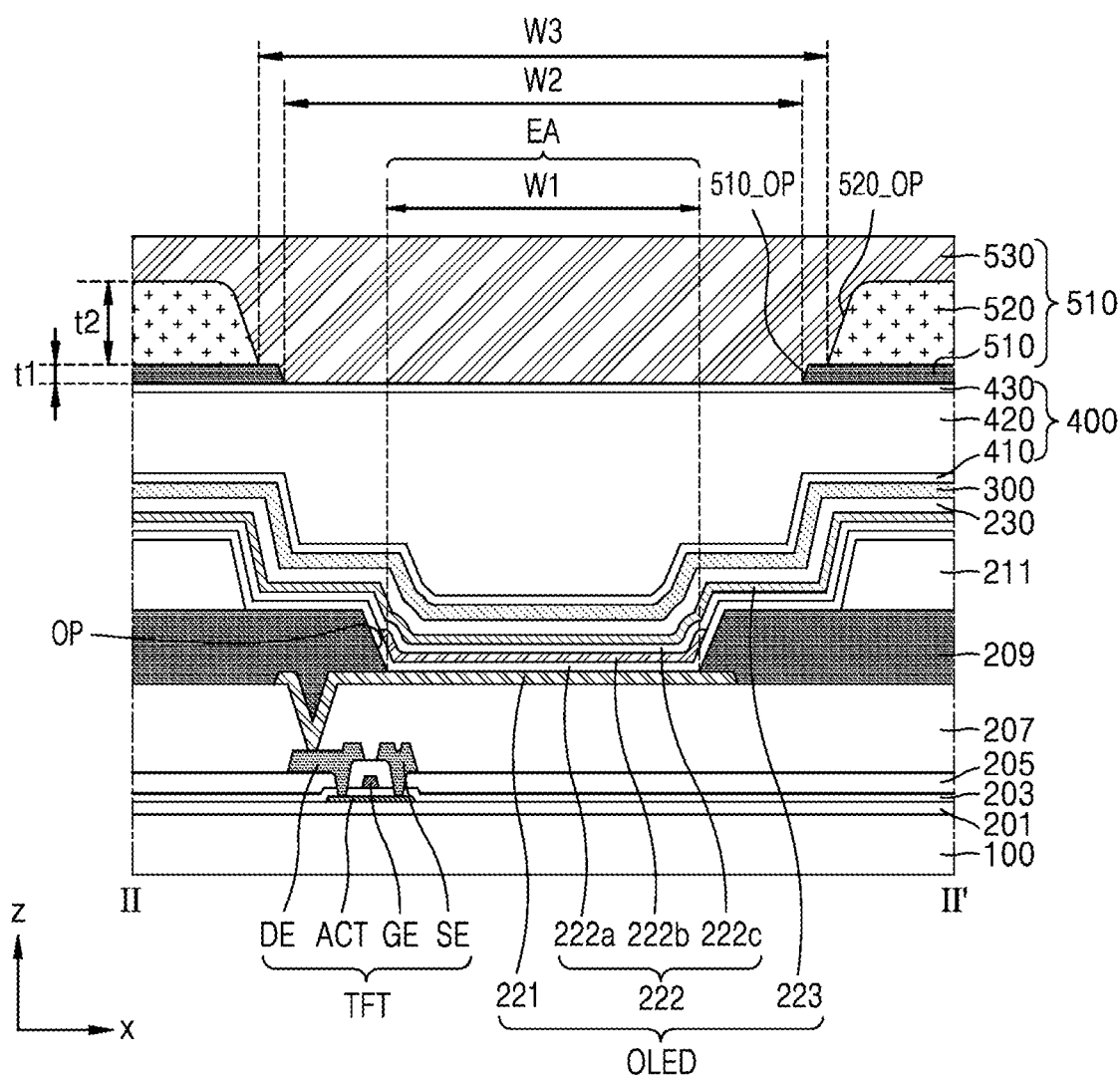
FIG. 8 is a cross-sectional view of a display apparatus according to one or more embodiments.

FIGS. 7 and 8 are cross-sectional views of a display apparatus according to embodiments. In FIGS. 7 and 8, the same reference symbols as those of FIG. 5 denote the same elements, and redundant descriptions thereof are not provided.

Referring to FIGS. 7 and 8, the display apparatus according to one or more embodiments includes an organic light-emitting diode OLED as a display element including an emission area EA, on a substrate 100, a low-reflection inorganic layer 300, a thin-film encapsulation layer 400, a light-shielding layer 510 including an opening 510_OP, a first insulating layer 520 including an opening 520_OP, and a second insulating layer 530 filling the opening 520_OP. In one or more embodiments, the display apparatus may further include a capping layer 230 between the organic light-emitting diode OLED and the low-reflection inorganic layer 300.

In FIG. 5, a case in which the third width W3 of the opening 520_OP of the first insulating layer 520 is less than the second width W2 of the opening 510_OP of the light-shielding layer 510 is shown. However, the present disclosure is not limited thereto.

Referring to FIGS. 7 and 8, the third width W3 of the opening 520_OP of the first insulating layer 520 may be greater than or equal to the second width W2. As shown in FIG. 7, a side surface of the opening 520_OP of the first insulating layer 520 may be in contact with a side surface of the opening 510_OP of the light-shielding layer 510. In some embodiments, as shown in FIG. 8, the opening 520_OP of the first insulating layer 520 may partially expose a body portion of the light-shielding layer 510. For example, a body portion of the first insulating layer 520 and the body portion of the light-shielding layer 510 may form a staircase-shaped step.

Figure 9:
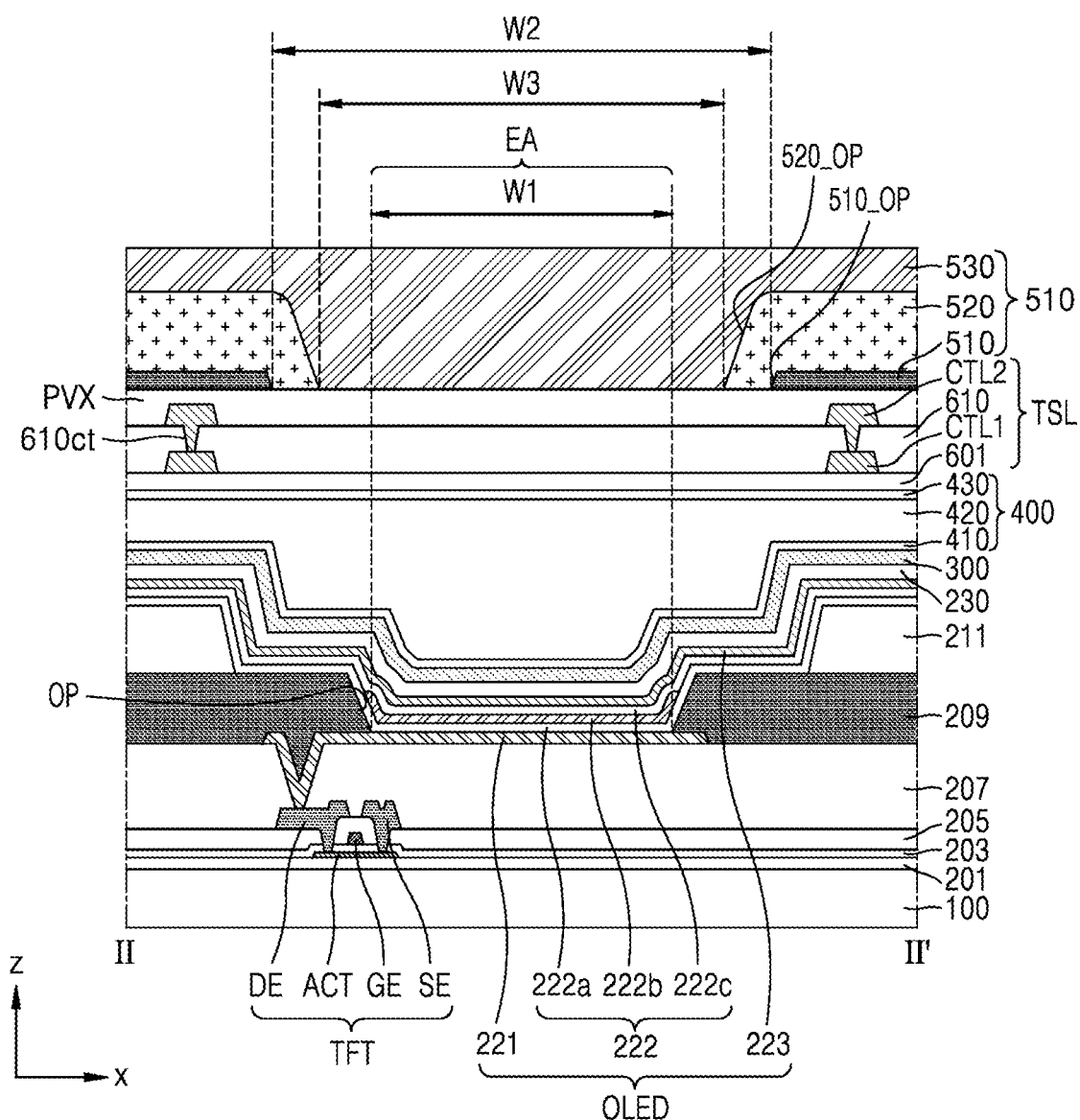
FIG. 9 is a cross-sectional view of a display apparatus according to one or more embodiments.

FIG. 9 is a cross-sectional view of a display apparatus according to one or more embodiments. In FIG. 9, the same reference symbols as those of FIG. 5 denote the same elements, and redundant descriptions thereof are not provided.

Referring to FIG. 9, the display apparatus according to one or more embodiments includes an organic light-emitting diode OLED as a display element including an emission area EA, on a substrate 100, a low-reflection inorganic layer 300, a thin-film encapsulation layer 400, a light-shielding layer 510 including an opening 510_OP, a first insulating layer 520 including an opening 520_OP, and a second insulating layer 530 filling the opening 520_OP. In one or more embodiments, the display apparatus may further include a capping layer 230 between the organic light-emitting diode OLED and the low-reflection inorganic layer 300.

In the present embodiments, a touch sensing layer TSL may be arranged between the thin-film encapsulation layer 400 and the light-shielding layer 510. The touch sensing layer TSL may be a layer for sensing a user's touch input, and may detect the user's touch input by utilizing at least one of suitable touch methods, such as a resistive method and/or a capacitive method.

The touch sensing layer TSL may be arranged on the thin-film encapsulation layer 400. The touch sensing layer TSL may include first and second sub-conductive layers CTL1 and CTL2 and a touch insulating layer 610. In some embodiments, the touch sensing layer TSL may further include a touch buffer layer 601.

The touch buffer layer 601 may be provided directly on the thin-film encapsulation layer 400. The touch buffer layer 601 may prevent or reduce damage to the thin-film encapsulation layer 400 and may serve to block or reduce an interference signal that may occur when the touch sensing layer TSL is driven. The touch buffer layer 601 includes an inorganic insulating material and/or an organic material such as silicon oxide ($SiO_x$), silicon nitride ($SiN_x$), and/or silicon oxynitride ($SiO_xN_y$), and may be provided as a single layer or a plurality of layers.

A first sub-conductive layer CTL1, the touch insulating layer 610, and a second sub-conductive layer CTL2 may be sequentially stacked on the touch buffer layer 601. The first sub-conductive layer CTL1 and the second sub-conductive layer CTL2 may be arranged below and above the touch insulating layer 610, respectively. In some embodiments, the second sub-conductive layer CTL2 acts as a sensor unit that detects whether or not there is a contact (e.g., user's touch input), and the first sub-conductive layer CTL1 may serve as a connection unit connecting a patterned second sub-conductive layer CTL2 in one direction. In other embodiments, the first sub-conductive layer CTL1 acts as a sensor unit that detects whether or not there is a contact, and the second sub-conductive layer CTL2 may serve as a connection unit connecting a patterned first sub-conductive layer CTL1 in one direction.

In some embodiments, both the first sub-conductive layer CTL1 and the second sub-conductive layer CTL2 may function as a sensor unit. In this case, the first sub-conductive layer CTL1 and the second sub-conductive layer CTL2 may be connected to each other through a contact hole 610ct provided in the touch insulating layer 610. When both the first sub-conductive layer CTL1 and the second sub-conductive layer CTL2 are utilized as the sensor unit, a resistance of a touch electrode may decrease, and thus, a response speed of the touch sensing layer TSL may be improved.

In some embodiments, the first sub-conductive layer CTL1 and the second sub-conductive layer CTL2 may be provided in a mesh structure so that light emitted by the organic light-emitting diode OLED may pass therethrough.

Accordingly, the first sub-conductive layer CTL1 and the second sub-conductive layer CTL2 may be arranged so as not to overlap the emission area of the organic light-emitting diode OLED.

The first sub-conductive layer CTL1 and the second sub-conductive layer CTL2 may include a metal layer and/or a transparent conductive layer, and the metal layer may include Mo, Ag, Ti, copper (Cu), Al, or one or more alloys thereof. The transparent conductive layer may include a transparent conductive oxide such as ITO, IZO, ZnO, and/or indium tin zinc oxide (ITZO). In some embodiments, the transparent conductive layer may include a conductive polymer such as poly(3,4-ethylenedioxythiophene) (PEDOT), metal nanowires, carbon nanotubes, and/or graphene. In one or more embodiments, each of the first sub-conductive layer CTL1 and the second sub-conductive layer CTL2 may have a three-layer structure of a Ti layer, an Al layer, and another Ti layer.

The touch insulating layer 610 may include an inorganic material and/or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least one of an acryl-based resin, a methacryl-based resin, a polyisoprene, a vinyl-based resin, an epoxy-based resin, a urethane-based resin, a cellulose-based resin, or a perylene-based resin.

A protective layer PVX may be arranged on the touch insulating layer 610 to cover the second sub-conductive layer CTL2. The protective layer PVX may serve to protect the touch sensing layer TSL. The protective layer PVX may include an inorganic material and/or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least one of an acryl-based resin, a methacryl-based resin, a polyisoprene, a vinyl-based resin, an epoxy-based resin, a urethane-based resin, a cellulose-based resin, or a perylene-based resin. The protective layer PVX may not be provided in some cases.

The light-shielding layer 510, the first insulating layer 520, and the second insulating layer 530 may be arranged on the touch sensing layer TSL, and may reduce external light reflection by the conductive layers included in the touch sensing layer TSL, for example, the first sub-conductive layer CTL1 and the second sub-conductive layer CTL2.

Figure 10:
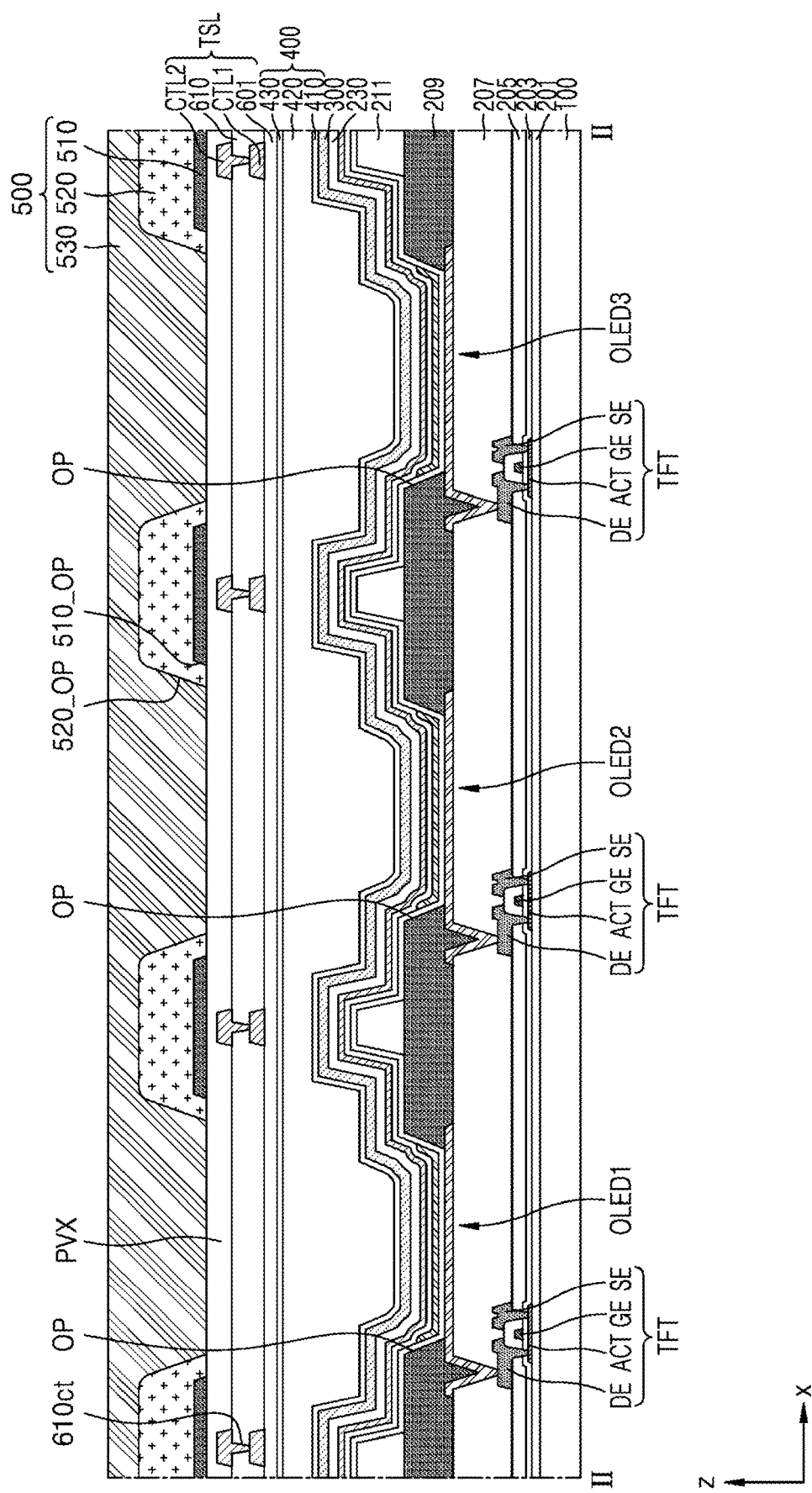
FIG. 10 is a cross-sectional view of a display apparatus according to one or more embodiments.

FIG. 10 is a cross-sectional view of a display apparatus according to one or more embodiments. In FIG. 10, the same reference symbols as those of FIG. 9 denote the same elements, and redundant descriptions thereof are not provided.

Referring to FIG. 10, the display apparatus according to one or more embodiments includes: a first organic light-emitting diode OLED1; a second organic light-emitting diode OLED2; and a third organic light-emitting diode OLED3, which emit (e.g., are configured to emit) light of different colors from each other, on a substrate 100; a low-reflection inorganic layer 300 commonly (e.g., integrally) arranged on the first organic light-emitting diode OLED1, the second organic light-emitting diode OLED2, and the third organic light-emitting diode OLED3; a thin-film encapsulation layer 400; a touch sensing layer TSL; a light-shielding layer 510 including an opening 510_OP; a first insulating layer 520 including an opening 520_OP; and a second insulating layer 530 filling the opening 520_OP. In one or more embodiments, the display apparatus may further include a capping layer 230 between the organic light-emitting diode OLED and the low-reflection inorganic layer 300.

An inorganic material included in the low-reflection inorganic layer 300 may have an absorption coefficient of about 0.3 or more. In one or more embodiments, the inorganic material included in the low-reflection inorganic layer 300 may have a refractive index of about 1 or more. In one or more embodiments, the low-reflection inorganic layer 300 may have a thickness of about 0.1 nm to about 50 nm, for example, about 0.5 nm to about 30 nm, or about 1 nm to about 20 nm.

The light-shielding layer 510 may have a wavelength spectrum that may absorb light in a visible ray band, for example, a wavelength range of about 380 nm to about 780 nm. The light-shielding layer 510 may be provided in black.

The first insulating layer 520 may have a wavelength spectrum absorbing light having a wavelength of a blue light band, for example, a wavelength of about 380 nm to about 500 nm. In some embodiments, the first insulating layer 520 may have a transmittance of about 0.5% or less for light in a wavelength band of about 400 nm to 490 nm. The first insulating layer 520 may be provided in yellow.

The second insulating layer 530 may absorb light in a first wavelength range of about 480 nm to about 505 nm and light in a second wavelength range of about 585 nm to about 605 nm, and may have a light transmittance of about 50% or less in the first wavelength range and the second wavelength range. For example, the second insulating layer 530 may absorb light having a wavelength out of a red, green, and/or blue emission wavelength range of the organic light-emitting diode OLED.

The low-reflection inorganic layer 300, the light-shielding layer 510, the first insulating layer 520, and the second insulating layer 530 may be commonly (e.g., integrally) provided in the first organic light-emitting diode OLED1, the second organic light-emitting diode OLED2, and the third organic light-emitting diode OLED3. The first organic light-emitting diode OLED1 may be to emit red light, the second organic light-emitting diode OLED2 may be to emit green light, and the third organic light-emitting diode OLED3 may be to emit blue light.

Because the second insulating layer 530 may be arranged in substantially the same configuration on the first organic light-emitting diode OLED1, the second organic light-emitting diode OLED2, and the third organic light-emitting diode OLED3, visibility may be improved and the process may be simplified.

In one or more embodiments, the light-shielding layer 510 and the first insulating layer 520 may be arranged in substantially the same configuration on the first organic light-emitting diode OLED1, the second organic light-emitting diode OLED2, and the third organic light-emitting diode OLED3.

The light-shielding layer 510 may absorb light having a wavelength of a visible ray band, and the first insulating layer 520 may additionally absorb light in a low wavelength band with high reflectance, for example, a blue ray band. Accordingly, a color expressed by the light-shielding layer 510 may be implemented as neutral black, thereby further reducing the reflectance of external light.

In some embodiments, the first insulating layer 520 may include a material having a refractive index different from that of the second insulating layer 530 by about 0.1 to about 0.2. Accordingly, the first insulating layer 520 and the second insulating layer 530 may serve as a lens to increase light extraction efficiency.

Figure 11:
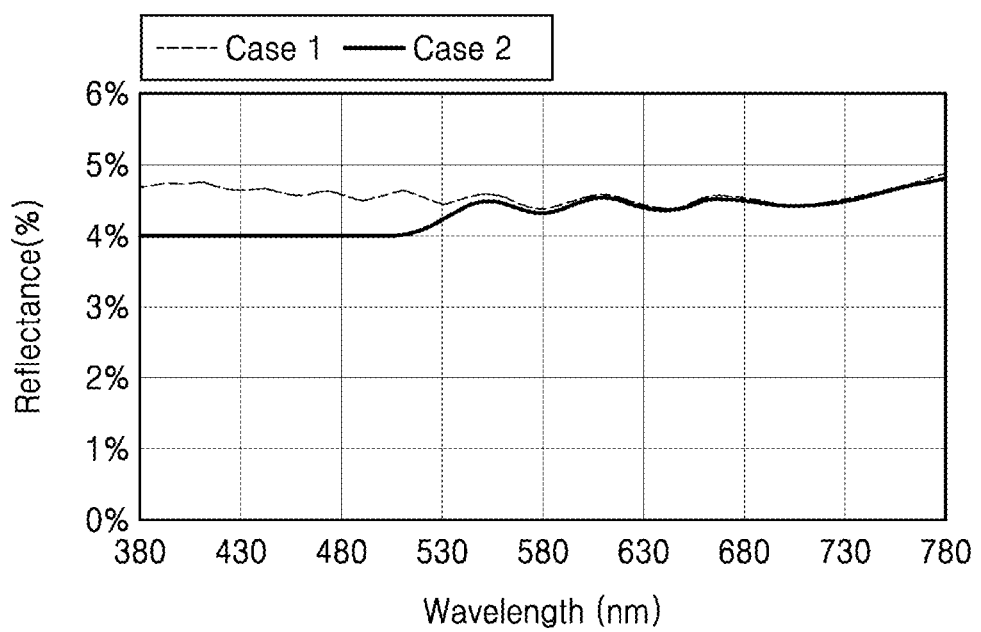
FIG. 11 is a graph of the reflectance of a light-shielding layer when the light-shielding layer includes a single layer and when the light-shielding layer includes two layers.

FIG. 11 is a graph of the reflectance of a light-shielding layer when a light-shielding layer is provided as a single layer, and when a first insulating layer is provided on the light-shielding layer.

Case 1 shows a case in which the light-shielding layer is provided as a single black layer. Case 2 shows a case in which the light-shielding layer provided in black and the first insulating layer provided in yellow for absorbing blue light are stacked.

Referring to FIG. 11, when comparing the reflectance of the light-shielding layer itself, for Case 1, it may be seen that the reflectance in a wavelength range of about 380 nm to about 530 nm is as high as about 4.5% or more. For Case 2, the reflectance in the wavelength range of about 380 nm to about 530 nm is lowered to about 4%, and thus, it may be seen that the overall external light reflectance may be lowered by the light-shielding layer 510 and the first insulating layer 520 that are akin to Case 2.

As described above, in the display apparatus according to one or more embodiments, a light-shielding layer and an insulating layer having different absorption wavelength spectra of light are stacked to improve the color reflection of the display apparatus.

In some embodiments, the display apparatus according to one or more embodiments is provided with a first insulating layer and a second insulating layer having different refractive indices, so that light extraction efficiency may be improved.

In some embodiments, the display apparatus according to one or more embodiments may include a low-reflection inorganic layer to improve light transmittance and visibility.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A display apparatus comprising:
a substrate;
a display element on the substrate;
a low-reflection inorganic layer on the display element;
a light-shielding layer on the low-reflection inorganic layer, the light-shielding layer comprising an opening corresponding to an emission area of the display element;
a first insulating layer on the light-shielding layer and comprising an opening corresponding to the emission area of the display element; and
a second insulating layer filling the opening of the light-shielding layer and the opening of the first insulating layer,
wherein the first insulating layer comprises a material configured to absorb light in a wavelength band of about 380 nm to about 500 nm, and
a thickness of the first insulating layer is greater than a thickness of the light-shielding layer.

2. The display apparatus of claim 1, wherein the light-shielding layer is in black, and the first insulating layer is in yellow.

3. The display apparatus of claim 1, wherein the second insulating layer is configured to selectively absorb light in a first wavelength range and a second wavelength range of a visible light spectrum.

4. The display apparatus of claim 3, wherein the first wavelength range is from about 480 nm to about 505 nm, and the second wavelength range is from about 585 nm to about 605 nm.

5. The display apparatus of claim 1, wherein a difference between a refractive index of the first insulating layer and a refractive index of the second insulating layer is from about 0.1 to about 0.2.

6. The display apparatus of claim 1, wherein a thickness of the second insulating layer is from about 2 to about 5 times greater than the thickness of the first insulating layer.

7. The display apparatus of claim 1, wherein the low-reflection inorganic layer comprises ytterbium (Yb), cobalt (Co), molybdenum (M), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or one or more combinations thereof.

8. The display apparatus of claim 1, wherein the first insulating layer covers at least a part of a side surface of the opening of the light-shielding layer.

9. The display apparatus of claim 1, further comprising a pixel-defining layer covering an edge of a pixel electrode of the display element and comprising an opening that exposes a central portion of the pixel electrode,
wherein the pixel-defining layer comprises a light-shielding material.

10. The display apparatus of claim 1, wherein a side surface of the opening of the first insulating layer is in contact with a side surface of the opening of the light-shielding layer.

11. The display apparatus of claim 1, wherein a body portion of the first insulating layer and a body portion of the light-shielding layer together comprise a staircase-shaped step.

12. The display apparatus of claim 1, further comprising:
a thin-film encapsulation layer on the low-reflection inorganic layer; and
a touch sensing layer on the thin-film encapsulation layer, wherein the light-shielding layer is on the touch sensing layer.

13. A display apparatus comprising:
a substrate;
a first display element, a second display element, and a third display element on the substrate and configured to emit light of different colors;
a low-reflection inorganic layer on all of the first display element, the second display element, and the third display element;
a light-shielding layer on the low-reflection inorganic layer, the light-shielding layer comprising openings respectively corresponding to emission areas of the first display element, the second display element, and the third display element;
a first insulating layer on the light-shielding layer and comprising openings respectively corresponding to the emission areas of the first, second, and third display elements; and
a second insulating layer filling the openings of the light-shielding layer and the openings of the first insulating layer,
wherein the first insulating layer comprises a material configured to absorb light in a wavelength band of about 380 nm to about 500 nm, and a difference between a refractive index of the first insulating layer and a refractive index of the second insulating layer is from about 0.1 to about 0.2.

14. The display apparatus of claim 13, wherein the light-shielding layer is in black, and the first insulating layer is in yellow.

15. The display apparatus of claim 13, wherein the second insulating layer is configured to selectively absorb light in a first wavelength range and a second wavelength range of a visible light spectrum.

16. The display apparatus of claim 13, wherein the low-reflection inorganic layer comprises ytterbium (Yb), cobalt (Co), molybdenum (M), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or one or more combinations thereof.

17. The display apparatus of claim 13, further comprising a pixel-defining layer covering an edge of each of a pixel electrode of the first display element, a pixel electrode of the second display element, and a pixel electrode of the third display element, the pixel-defining layer comprising openings respectively exposing central portions of the pixel electrodes of the first display element, the second display element, and the third display element,
wherein the pixel-defining layer comprises a light-shielding material.

18. The display apparatus of claim 13, wherein the refractive index of the second insulating layer is greater than the refractive index of the first insulating layer.

19. The display apparatus of claim 13, wherein the first insulating layer covers at least a part of a side surface of the openings of the light-shielding layer.

20. The display apparatus of claim 13, further comprising:
a thin-film encapsulation layer on the low-reflection inorganic layer; and
a touch sensing layer on the thin-film encapsulation layer, wherein the light-shielding layer is on the touch sensing layer.

* * * * *